United States Patent
Pinney

(10) Patent No.: US 6,549,476 B2
(45) Date of Patent: Apr. 15, 2003

(54) DEVICE AND METHOD FOR USING COMPLEMENTARY BITS IN A MEMORY ARRAY

(75) Inventor: David L. Pinney, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/829,140

(22) Filed: Apr. 9, 2001

(65) Prior Publication Data

US 2002/0145917 A1 Oct. 10, 2002

(51) Int. Cl.[7] .................................................. G11C 7/00
(52) U.S. Cl. ........................ 365/190; 365/202; 365/196
(58) Field of Search ........................... 365/190, 189.04, 365/189.07, 202, 196, 203, 230.06

(56) References Cited

U.S. PATENT DOCUMENTS

| | | |
|---|---|---|
| 4,112,512 A | 9/1978 | Arzubi et al. |
| 4,459,685 A | 7/1984 | Sud et al. |
| 4,601,019 A | 7/1986 | Shah et al. |
| 5,144,584 A | 9/1992 | Hoshino |
| 5,291,443 A | 3/1994 | Lim |
| 5,339,273 A | 8/1994 | Taguchi |
| 5,373,475 A | 12/1994 | Nagase |
| 5,381,368 A | 1/1995 | Morgan et al. |
| 5,422,850 A | 6/1995 | Sukegawa et al. |
| 5,440,517 A | 8/1995 | Morgan et al. |
| 5,461,587 A | 10/1995 | Oh |
| 5,469,393 A | 11/1995 | Thomann |
| 5,471,430 A | 11/1995 | Sawada et al. |
| 5,502,675 A | 3/1996 | Kohno et al. |
| 5,528,539 A | 6/1996 | Ong et al. |
| 5,555,212 A | 9/1996 | Toshiaki et al. |
| 5,592,428 A | 1/1997 | Harrand et al. |
| 5,689,465 A | 11/1997 | Sukegawa et al. |
| 5,689,467 A | 11/1997 | Hashimoto |
| 5,724,286 A | 3/1998 | Gillingham |
| 5,754,486 A | 5/1998 | Nevill et al. |
| 5,781,483 A | 7/1998 | Shore |
| 5,936,874 A | 8/1999 | Clampitt et al. |
| 6,005,816 A | 12/1999 | Manning et al. |
| 6,044,029 A | 3/2000 | Shore |
| 6,075,737 A * | 6/2000 | Mullarkey et al. .......... 365/207 |
| 6,075,743 A | 6/2000 | Barth et al. |
| 6,122,213 A | 9/2000 | Shore |
| 6,243,311 B1 * | 6/2001 | Keeth ......................... 365/306 |
| 6,285,618 B1 | 9/2001 | Shore |

FOREIGN PATENT DOCUMENTS

WO    WO 97/28532    8/1997

OTHER PUBLICATIONS

Keeth, et al., "DRAM Circuit Design," IEEE Press, 2001, pp. 35–43.

* cited by examiner

Primary Examiner—David Nelms
Assistant Examiner—Thong Le
(74) Attorney, Agent, or Firm—Kenneth W. Bolvin; Leffert Jay & Polglaze, P.A.

(57) ABSTRACT

An apparatus and method of operating an open digit line and a folded digit line DRAM memory array having a plurality of memory cells wherein, in a plan view, each memory cell, in one embodiment, has an area of $6F^2$. One method comprises, storing a first bit in a first memory cell and storing a second bit that is complementary to the first bit in a second memory cell. The first bit and the second bit form a data bit. The data bit is read by comparing a voltage difference between the first memory cell and the second memory cell.

84 Claims, 12 Drawing Sheets

DEVICE AND METHOD FOR USING COMPLEMENTARY BITS IN A MEMORY ARRAY

TECHNICAL FIELD OF THE INVENTION

The present invention relates in general to memory arrays and in particular to storing two bits for each data bit in a memory array.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is a type of RAM. A DRAM memory is made up of memory cells. Each cell or bit includes a transistor and a capacitor. A cell is capable of storing information in the form of a "1" or "0" bit as an electrical charge on the capacitor. Since a capacitor will lose its charge over time, a memory device incorporating a DRAM memory must include logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

While a cell is being refreshed it cannot be read by a processor. This causes systems incorporating DRAMS to be slower than systems incorporating RAMS. However, DRAMS are more commonly used than RAMS because their circuitry is simpler and because they can hold up to four times as much data. Another disadvantage in using a typical DRAM is the amount of power needed to constantly refresh the cells. This disadvantage becomes more crucial as apparatuses incorporating memory devices are designed to use less and less power.

For the reasons stated above, and for other reasons stated below which will become apparent to those skilled in the art upon reading and understanding the present specification, there is a need in the art for a DRAM memory device whose cells can go for an extended period of time without having to be refreshed

SUMMARY OF THE INVENTION

The above-mentioned problems with non-volatile memory devices and other problems are addressed by the present invention and will be understood by reading and studying the following specification.

In one embodiment, a DRAM memory device having a folded architecture memory array of memory cells wherein, in a plan view, each memory cell has an area of $6F^2$ is disclosed. The DRAM memory device includes a plurality of pairs of associated memory cells to store data bits and a plurality of sense amplifiers. Each pair of associated memory cells includes a first memory cell to store a first bit and a second memory cell to store a second bit that is a complement of the first bit. The first bit and the second bit form a data bit. The plurality of sense amplifiers are used to read the memory cells. Each sense amplifier is coupled to an associated pair of memory cells. Moreover, each sense amplifier compares a voltage between the first bit of the first memory cell and the second bit of the second memory cell to read the data bit.

In another embodiment, a DRAM memory device having an open architecture memory array of memory cells wherein, in a plan view, each memory cell has an area of $6F^d$. The DRAM memory device includes a plurality of pairs of associated memory cells to store data bits and a plurality of sense amplifiers. Each pair of associated memory cells includes a first memory cell to store a first bit and a second memory cell to store a second bit that is a complement of the first bit. The first bit and the second bit form a data bit. The plurality of sense amplifiers are used to read the memory cells. Each sense amplifier is coupled to an associated pair of memory cells. Moreover, each sense amplifier compares a voltage between the first bit of the first memory cell and the second bit of the second memory cell to read the data bit.

In another embodiment, a DRAM memory device includes a memory array having a plurality of memory cells arranged in a folded digit line architecture, a plurality of sense amplifiers, and a control logic circuit. Each memory cell has an area of $6F^2$ and each memory cell is associated with another memory cell, wherein each pair of associated memory cells store complementary bits that make up a data bit. The plurality of sense amplifiers are used to read and refresh memory cells. Each sense amplifier is coupled to a pair of associated memory cells. The control logic circuit is used to control memory operations. More specifically, the control circuit selectively fires word lines coupled to associated memory cells simultaneously so a sense amplifier coupled to the associated pair of memory cells can read and refresh the data bit stored in the pair of associated memory cells.

In another embodiment, a DRAM memory device includes a memory array having a plurality of memory cells arranged in an open digit line architecture, a plurality of sense amplifiers, and a control logic circuit. Each memory cell has an area of $6F^2$ and each memory cell is associated with another memory cell, wherein each pair of associated memory cells store complementary bits that make up a data bit. The plurality of sense amplifiers are used to read and refresh memory cells. Each sense amplifier is coupled to a pair of associated memory cells. The control logic circuit is used to control memory operations. More specifically, the control circuit selectively fires word lines coupled to associated memory cells simultaneously so a sense amplifier coupled to the associated pair of memory cells can read and refresh the data bit stored in the pair of associated memory cells.

In another embodiment, a memory system comprises a processor to provide external commands and a DRAM memory device. The DRAM memory device includes a memory array, sense amplifiers, and a control logic circuit. The memory array has memory cells arranged in a folded digit line architecture. Each memory cell has an area of $6F^2$ in a plane view. Moreover, each memory cell is associated with another memory cell, wherein each pair of associated memory cells store complementary bits to form a data bit. The sense amplifiers are used for each pair of associated memory cells to read data bits. Each sense amplifier is coupled to compare voltages of the bits in associated pairs of memory cells. The control circuit is used to receive external commands from the processor and to control memory operations. More specifically, the control circuit selectively fires word lines coupled to associated memory cells simultaneously to read a data bit.

In another embodiment, a memory system comprises a processor to provide external commands and a DRAM memory device. The DRAM memory device includes a memory array, sense amplifiers, and a control logic circuit. The memory array has memory cells arranged in an open digit line architecture. Each memory cell has an area of $6F^2$ in a plane view. Moreover, each memory cell is associated with another memory cell, wherein each pair of associated memory cells store complementary bits to form a data bit. The sense amplifiers are used for each pair of associated memory cells to read data bits. Each sense amplifier is coupled to compare voltages of the bits in associated pairs of memory cells. The control circuit is used to receive external commands from the processor and to control memory operations. More specifically, the control circuit selectively fires word lines coupled to associated memory cells simultaneously to read a data bit.

In another embodiment, a DRAM memory device having a folded architecture memory array of memory cells wherein, in a plan view, each memory cell having an area of less than $8F^2$ is disclosed. The DRAM memory device includes a plurality of pairs of associated memory cells to store data bits and a plurality of sense amplifiers. Each pair of associated memory cells includes a first memory cell to store a first bit and a second memory cell to store a second bit that is a complement of the first bit. The first bit and the second bit form a data bit. The plurality of sense amplifiers are used to read the memory cells. Each sense amplifier is coupled to an associated pair of memory cells. Moreover, each sense amplifier compares a voltage between the first bit of the first memory cell and the second bit of the second memory cell to read the data bit.

In another embodiment, a DRAM memory device having an open architecture memory array of memory cells wherein, in a plan view, each memory cell having an area of less than $8F^2$. The DRAM memory device includes a plurality of pairs of associated memory cells to store data bits and a plurality of sense amplifiers. Each pair of associated memory cells includes a first memory cell to store a first bit and a second memory cell to store a second bit that is a complement of the first bit. The first bit and the second bit form a data bit. The plurality of sense amplifiers are used to read the memory cells. Each sense amplifier is coupled to an associated pair of memory cells. Moreover, each sense amplifier compares a voltage between the first bit of the first memory cell and the second bit of the second memory cell to read the data bit.

In another embodiment, a method of operating a folded digit line DRAM memory array having a plurality of memory cells wherein, in a plan view, each memory cell has an area of $6F^2$ is disclosed. The method comprising, storing a first bit in a first memory cell, and storing a second bit that is complementary to the first bit in a second memory cell, wherein the first bit and the second bit form a data bit.

In another embodiment, a method of operating an open digit line DRAM memory array having a plurality of memory cells wherein, in a plan view, each memory cell has an area of $6F^2$ is disclosed. The method comprising, storing a first bit in a first memory cell, and storing a second bit that is complementary to the first bit in a second memory cell. Wherein the first bit and the second bit form a data bit.

In another embodiment, a method of operating a DRAM memory device having a memory array with multiple memory cells arranged in a folded digit line architecture wherein each memory cell has an area of $6F^2$ is disclosed. The method comprising, storing a charge in a first memory cell, and storing a complementary charge on an associated second memory cell, wherein the charge in the first memory cell and the complementary charge in the associated second memory cell together form a single data bit.

In another embodiment, a method of operating a DRAM memory device having a memory array with multiple memory cells arranged in an open digit line architecture wherein each memory cell has an area of $6F^2$ is disclosed. The method comprising, storing a charge in a first memory cell and storing a complementary charge on an associated second memory cell. Wherein the charge in the first memory cell and the complementary charge in the associated second memory cell together form a single data bit.

In another embodiment, a method of refreshing memory cells in a DRAM memory having a memory array of memory cells arranged in an folded digit line architecture wherein, in a plan view, each memory cell has an area of $6F^2$ is disclosed. The method comprising, storing a first bit in a first memory cell, storing a complementary second bit in an associated second memory cell, wherein the first bit and the complementary second bit form a data bit, comparing a voltage difference between the first bit in the first memory cell and the second bit in the second memory cell with a sense amplifier to read the data bit, restoring the first bit in the first memory cell to a predetermined voltage level, and restoring the second bit in the second memory cell to a predetermined voltage level.

In another embodiment, a method of refreshing memory cells in a DRAM memory having a memory array of memory cells arranged in an open digit line architecture wherein, in a plan view, each memory cell has an area of $6F^2$ is disclosed. The method comprising, storing a first bit in a first memory cell, storing a complementary second bit in an associated second memory cell, wherein the first bit and the complementary second bit form a data bit, comparing a voltage difference between the first bit in the first memory cell and the second bit in the second memory cell with a sense amplifier to read the data bit, restoring the first bit in the first memory cell to a predetermined voltage level, and restoring the second bit in the second memory cell to a predetermined voltage level.

In another embodiment, a method of operating a folded digit line DRAM memory array having a plurality of memory cells wherein, in a plan view, each memory cell has an area less than $8F^2$ is disclosed. The method comprising, storing a first bit in a first memory cell, and storing a second bit that is complementary to the first bit in a second memory cell, wherein the first bit and the second bit form a data bit.

In yet another embodiment, a method of operating an open digit line DRAM memory array having a plurality of memory cells wherein, in a plan view, each memory cell has an area of less than $8F^2$ is disclosed. The method comprising, storing a first bit in a first memory cell, and storing a second bit that is complementary to the first bit in a second memory cell. Wherein the first bit and the second bit form a data bit.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention operates a DRAM memory array in a half density mode. That is, the present invention uses two cells of the memory array to store each data bit. Although this approach reduces the overall capacity of the memory in half, it effectively expands the period of time needed between refreshes of the memory cells. This leads to numerous advantages over the prior art. To better understand the present invention, further background is first provided.

Figure 1:
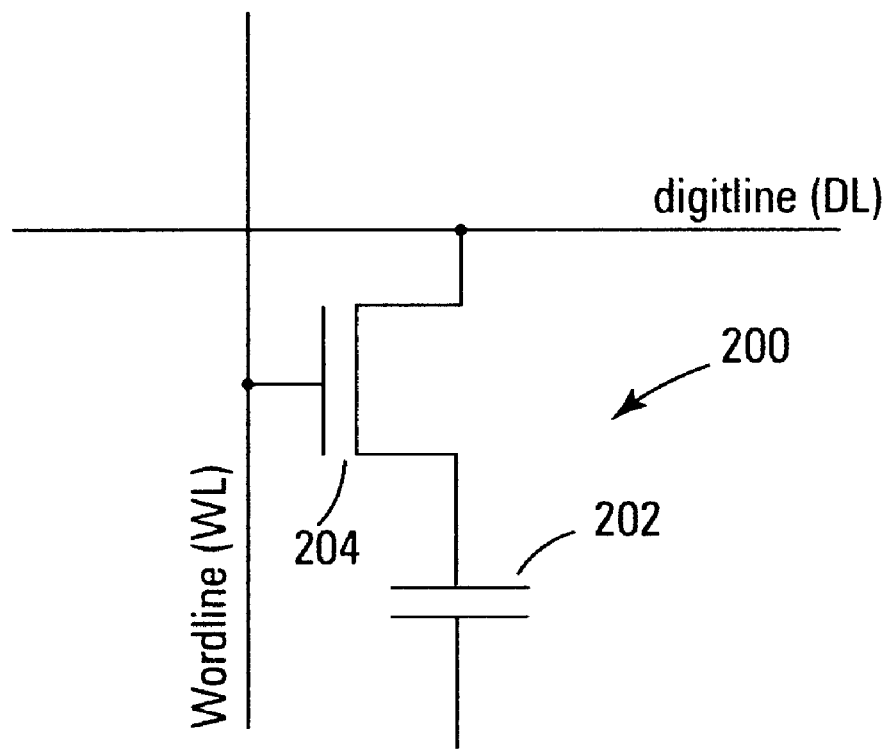
FIG. 1 is a schematic diagram of a DRAM memory cell of the prior art.

Referring to FIG. 1, a DRAM memory cell 200 is illustrated. The cell 200 is illustrated as having a capacitor 202 and an access transistor 204. The capacitor 202 is used to store a charge. The charge represents a bit of information. The access transistor 204 acts as a switch for the capacitor 202. That is, the access transistor 204 controls when a charge is placed on the capacitor 202, and when a charge is discharged from the capacitor 202. A word line is coupled to a control gate of the access transistor 204. When a cell is read, the word line activates the control gate of the transistor 204. Once this happens, any charge (or lack of charge) stored on the capacitor 202 is shared with a conductive digit line coupled to the drain of the access transistor 204. This charge is then detected in the digit line by a sense amplifier and then processed to determine the bit state of the cell 200. Tiling a selected quantity of cells together, such that the cells along a given digit line do not share a common word line and the cells along a common word line do not share a common digit line, forms a memory array. A typical memory array contains thousands or millions of cells.

Figure 2:
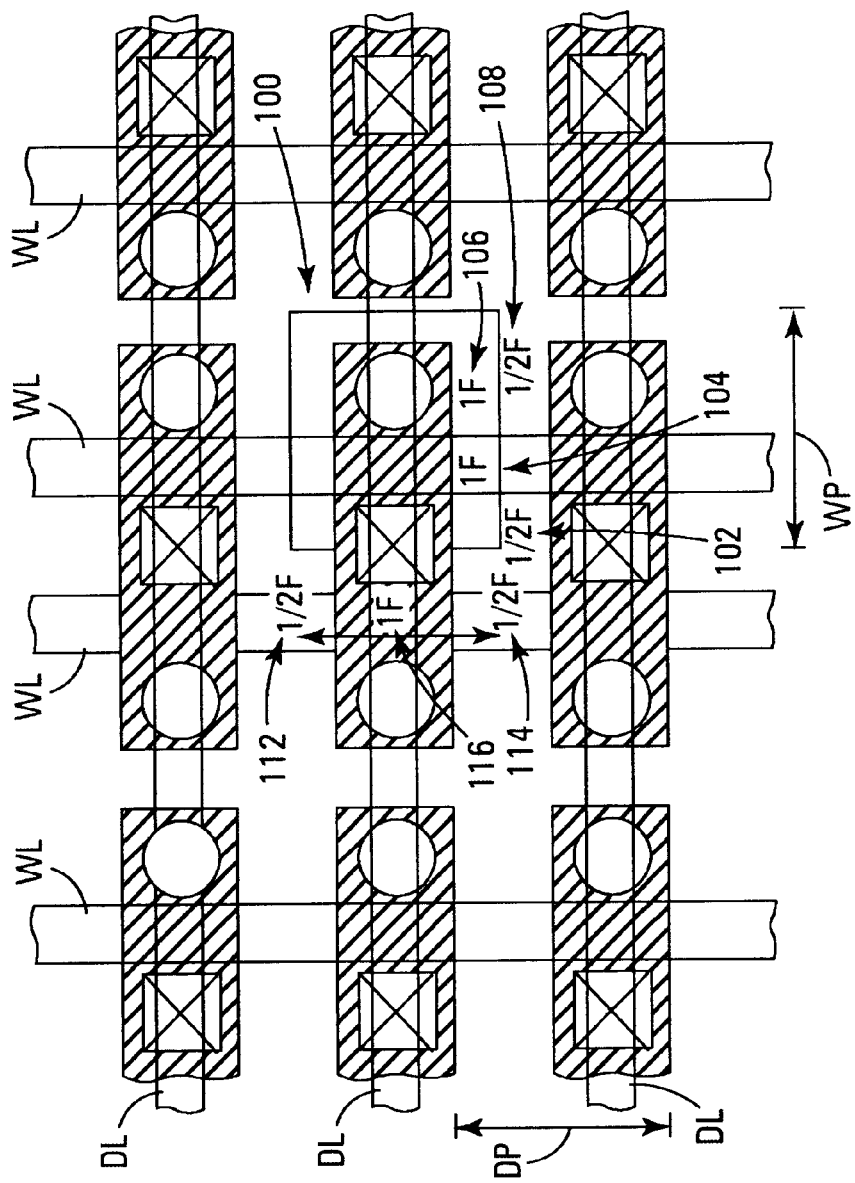
FIG. 2 is a plan view diagram of an open digit line architecture of the prior art.

A plan view of a portion of a DRAM memory array is illustrated in FIG. 2. In this example of a DRAM memory array layout, cells are paired to share a common contact to the digit line (DL), which reduces the array size by eliminating duplication. This layout is arranged in an open digit line architecture wherein each memory cell 100 has an area equal to $6F^2$. That is, the area of a memory cell 100 in this layout is described as $6F^2$. As illustrated in FIG. 2, a box is drawn around a memory cell 100 to show the cell's outer boundary. Along the horizontal axis of the memory cell 100, the box includes one-half digit line contact feature 102, one word line feature 104, one capacitor feature 106, and one-half field oxide feature 108 for a total of three features. Along the vertical axis of the memory cell 100, the box contains two one-half field oxide features 112, 114 and one active area feature 116 for a total of two features. Therefore, the total area of a cell 100 is $3F*2F=6F^2$. Moreover, as FIG. 2 illustrates, pairs of cells in a row are isolated from other pairs of cells in the row. This is accomplished, in this example of an open digit line architecture, by grounding selective word lines (not shown). A discussion of DRAM circuit design including open digit line architecture is provided in Brent Keeth and Jacob Baker, DRAM *Circuit Design, A Tutorial*, 1–103 (IEEE Press 2001), which is incorporated herein by reference.

Figure 2A:
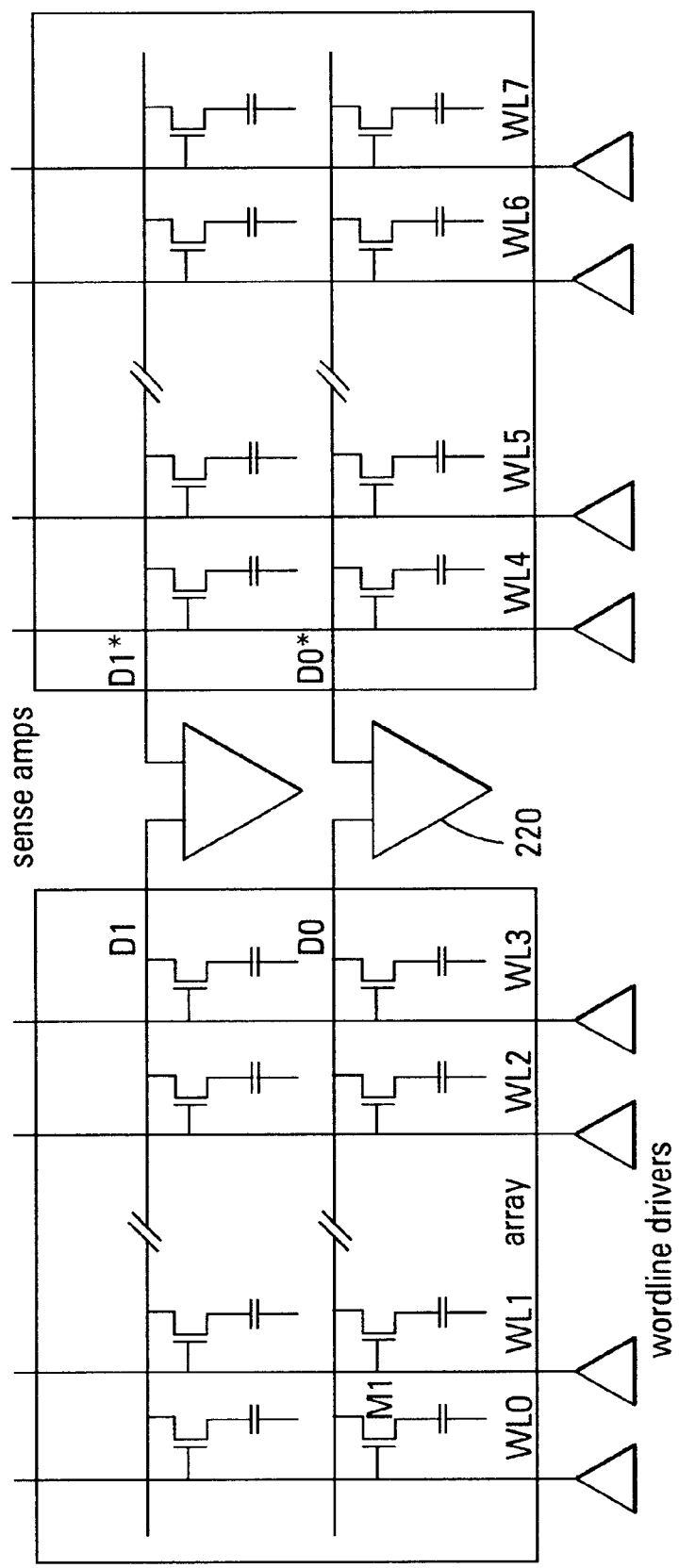
FIG. 2A is a schematic diagram of the physical layout of an open digit line architecture memory of the prior art.

Referring to FIG. 2A, a schematic diagram of portion of an open digit line DRAM array is illustrated, wherein the cells have an area of $6F^2$. As illustrated, sense amplifiers are coupled between digit line D1 and complementary digit line D1* and between D0 and complementary digit line D0*. Cells with a 1 bit can be expressed as having a +Vcc/2 stored on them and cells with a 0 bit can be expressed as having a Vcc/2 stored on them. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a word line coupled to the cell to be read. For example, if cell M1 is to be read, a voltage of Vccp is applied to word line WL0 after the digit lines D0 and D0* are equilibrated to Vcc/2. The charge on the capacitor of M1 is shared with digit line D0. In response to the shared charge, the voltage in digit line M1 either increases if cell M1 stored a 1 bit, or decreases if cell M1 stored a 0 bit. Thereafter, sense amplifier 220 compares the voltage in digit line D0 against the voltage in digit line D0*.

Figure 3:
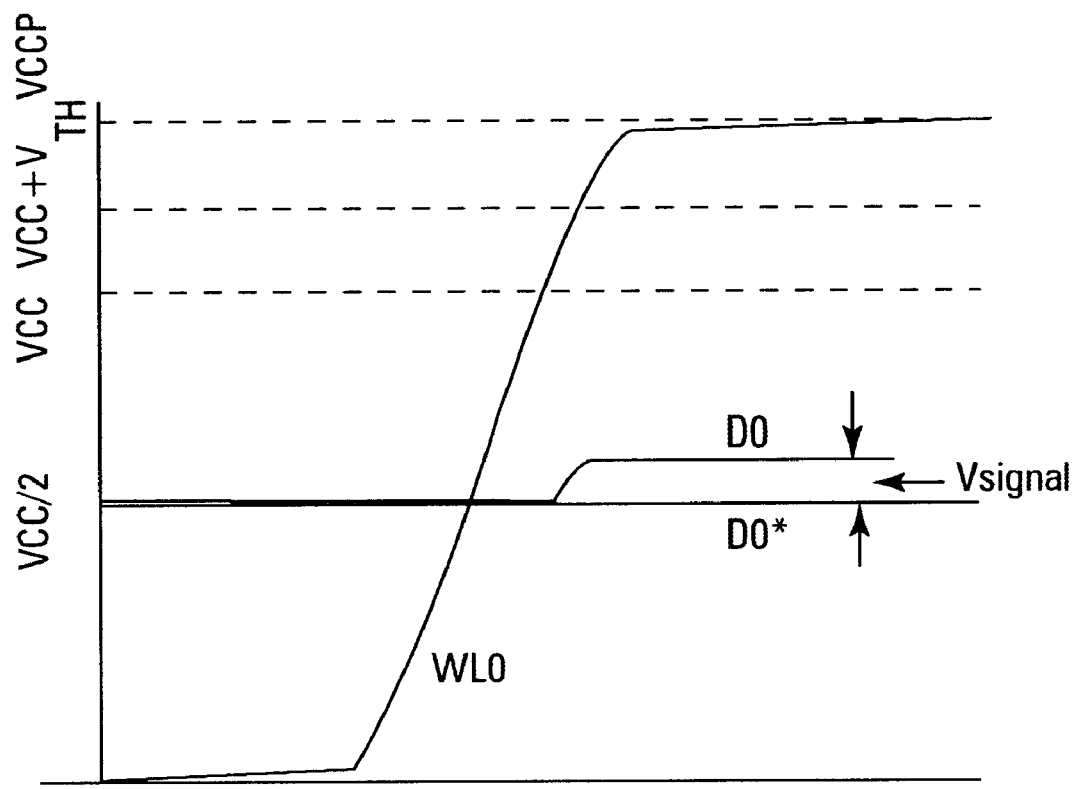
FIG. 3 is a table that illustrates the waveforms during a typical read or write operation in the prior art.

Referring to FIG. 3, the waveforms during a typical read or write operation are illustrated, wherein cell M1 has a 1 bit stored. The magnitude of the voltage difference or signal (Vsignal) between digit line D0 and digit line D0* is a function of the cell capacitance (Ccell), the digit line capacitance (Cdigit), and the voltage stored in the cell prior to access (Vcell). This can be expressed as Vsignal=(Vcell*Ccell)/(Cdigit+Ccell) volts. For example, a design in which Vcell=1.65V, Ccell=50 fF, and Cdigit=300 fF yields a Vsignal of 235 mV.

Figure 4:
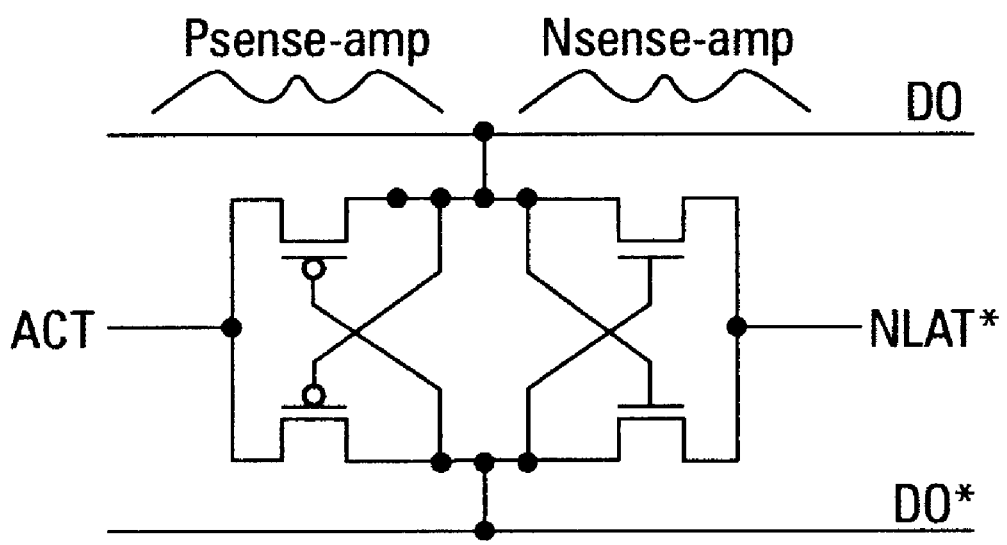
FIG. 4 is a schematic diagram of a typical sense amp of the prior art.

After the cell has been accessed, sensing occurs. Sensing is necessary to properly read the data and refresh the cells. A simplified illustration of a typical sense amplifier is shown in FIG. 4. As FIG. 4 illustrates, the sense amplifier includes a Psense-amp and a Nsense-amp. The Psense-amp includes a pMOS pair of transistors, and the Nsense-amp includes an nMOS pair of transistors. Also labeled in FIG. 4 is node ACT (for ACTive pull up) on the Psense-amp, and node NLAT* (Nsense-amp LATch) on the Nsence-amp. ACT and NLAT provide power and ground. Initially, NLAT* is biased to Vcc/2 and Act is biased to Vss or signal ground. Since, the digit line pair D0 and D0* are both at Vcc/2, the nMOS pair of transistors and the pMOS pair of transistors are turned off. When a cell is accessed that is coupled to either D0 or D0*, a voltage difference occurs between D0 and D0*. While one of the digit lines contains charge from the cell access, the other digit line serves as a reference for the sensing operation.

After the cell is accessed the sense amplifiers are generally fired sequentially, the Nsense-amp first, followed by the Psense-amp. The Nsense-amp is fired by bring NLAT* toward ground. As the voltage difference between NLAT* and the digit lines approaches Vth, the nMOS transistor whose gate is connected to the higher voltage digit line begins to conduct. This conduction causes the low-voltage digit line to be discharged toward the NLAT* voltage. Ultimately, NLAT* will reach ground, and the digit line will be brought to ground potential. Sometime after the Nsenceamp fires, the Psense-amp is activated by bring the ACT toward Vcc. The Psense-amp operates in a complementary fashion to the Nsense-amp. With the low-voltage digit line approaching ground, there is a strong signal to drive the appropriate pMOS transistor into conduction. This conduction charges the high-voltage digit line toward ACT, ultimately reaching Vcc. The capacitor of the cell being read is refreshed during the sensing operation. This is accomplished by keeping the access transistor of the cell on when the Psence-amp is activated. The charge the capacitor of the cell had prior to accessing the cell is fully restored. That is, the charge will be restored to Vcc for a 1 bit and GND for a 0 bit.

Figure 5:
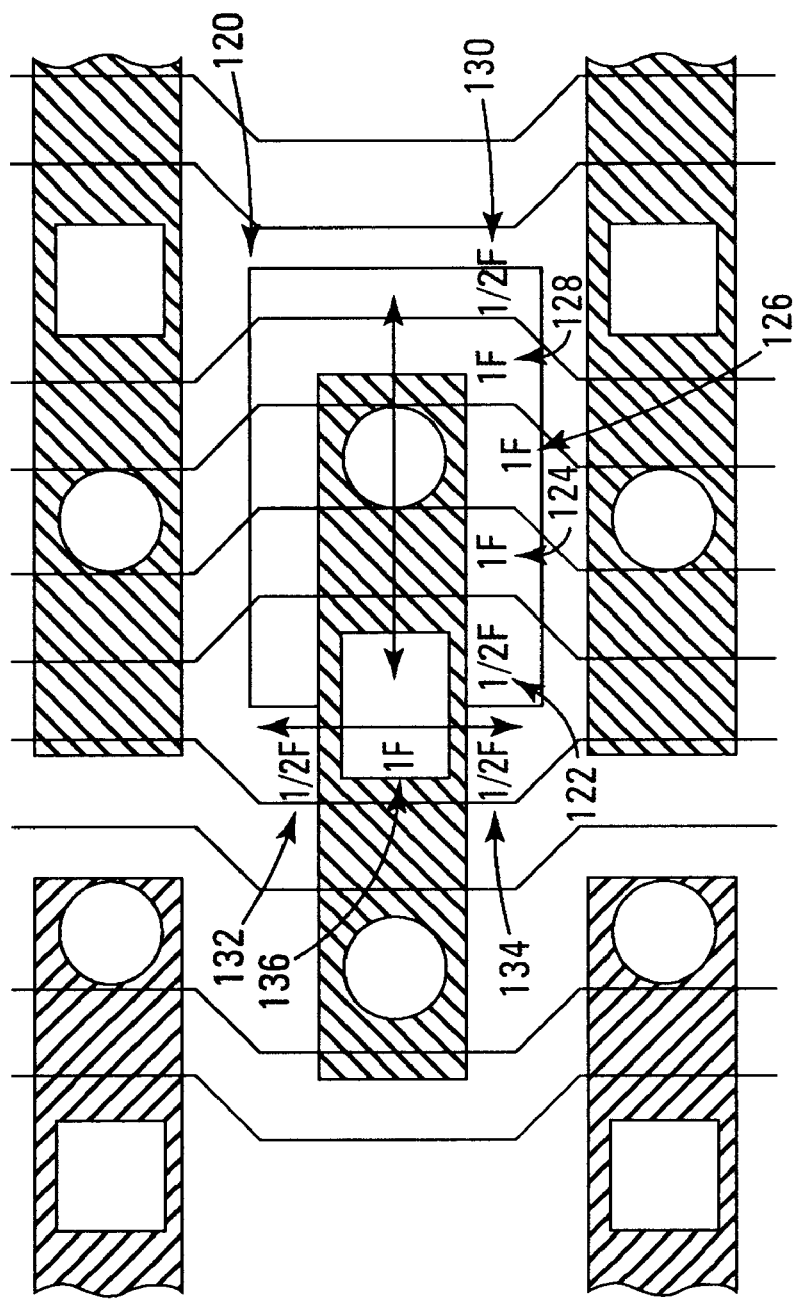
FIG. 5 is a plan view diagram of the physical layout of a folded line architecture memory in the prior art.

A commonly used architecture for a DRAM array is a folded line architecture. A plan view of a portion of a folded line architecture array is illustrated in FIG. 5. In this folded line architecture array, each cell is illustrated as having an area of $8F^2$. As illustrated, a box has been drawn in FIG. 5 to illustrate a cell's outer boundary. Along the horizontal axis of the memory cell 120, the box includes one-half digit line contact feature 122, one word line feature 124, one capacitor feature 126, one poly feature 128 and one-half field oxide feature 130 for a total of 4 features. Along the vertical axis of the cell 120, the box contains two one-half field oxide features 132, 134 and one active area feature 136 for a total of two features. Therefore, the area of the cell is 4F*2F=$8F^2$.

Figure 5A:
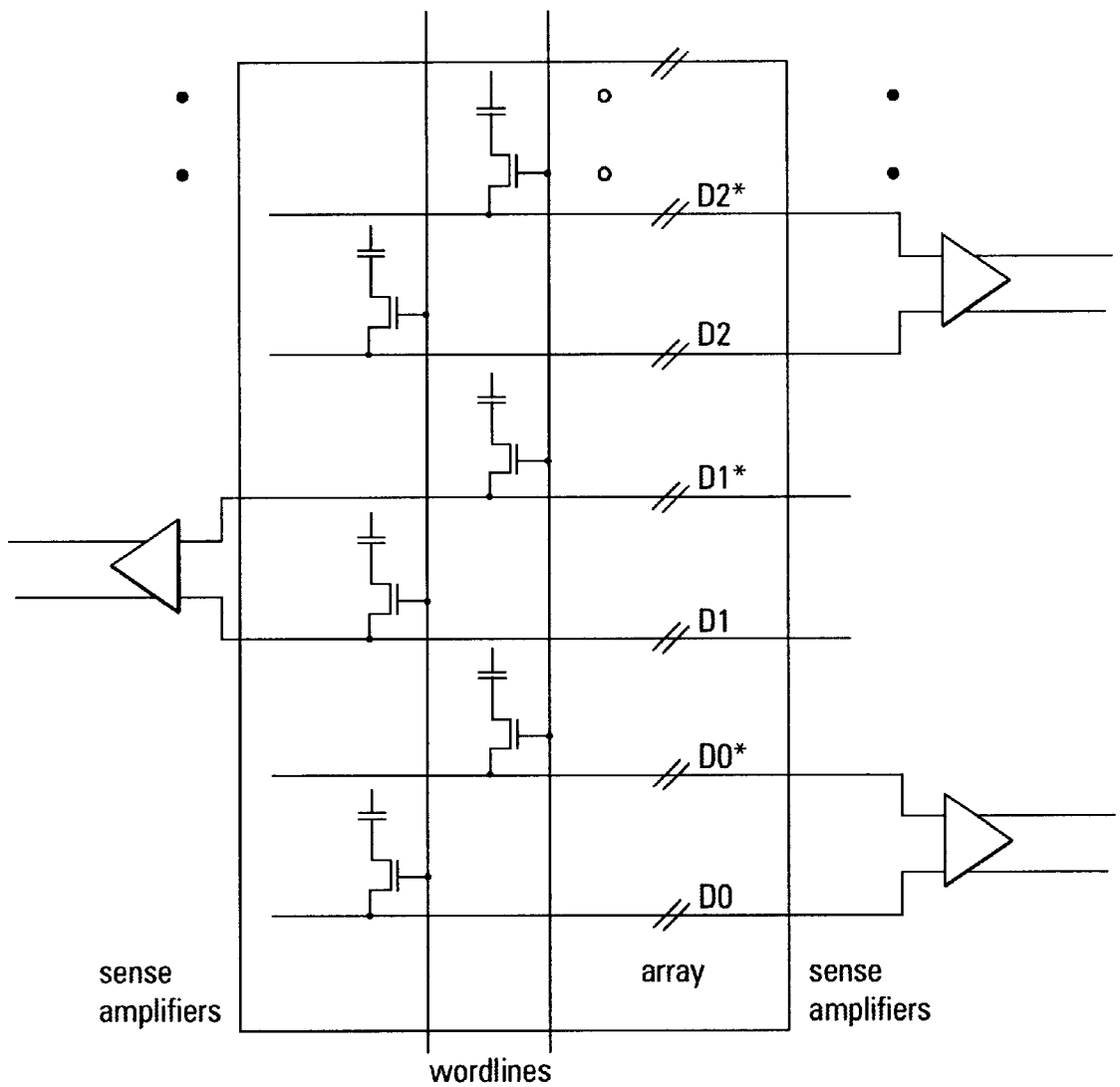
FIG. 5A is a schematic diagram of the physical layout of a folded line architecture memory in the prior art.

The increase in area of the $8F^2$ cells is due to the staggering of the cells in the array. Staggering the cells allows each word line to connect with a transistor of every other digit line. To accomplish this arrangement, each word line must pass around the access transistors on the remaining digit lines as field ploy. Thus, the staggering of the memory cells results in field poly in each cell that adds two square features. An $8F^2$ cell in a folded line architecture is approximately 25% larger than a $6F^2$ memory cell in an open digit line architecture. Referring to FIG. 5A, a schematic diagram of a folded line architecture is illustrated. FIG. 5A also illustrates how the sense amplifiers are coupled to the cells. Cells having areas of $8F^2$ are more commonly used in folded line architecture arrays then cells having $6F^2$ areas because they are generally less complicated to incorporate in dies.

Figure 6:
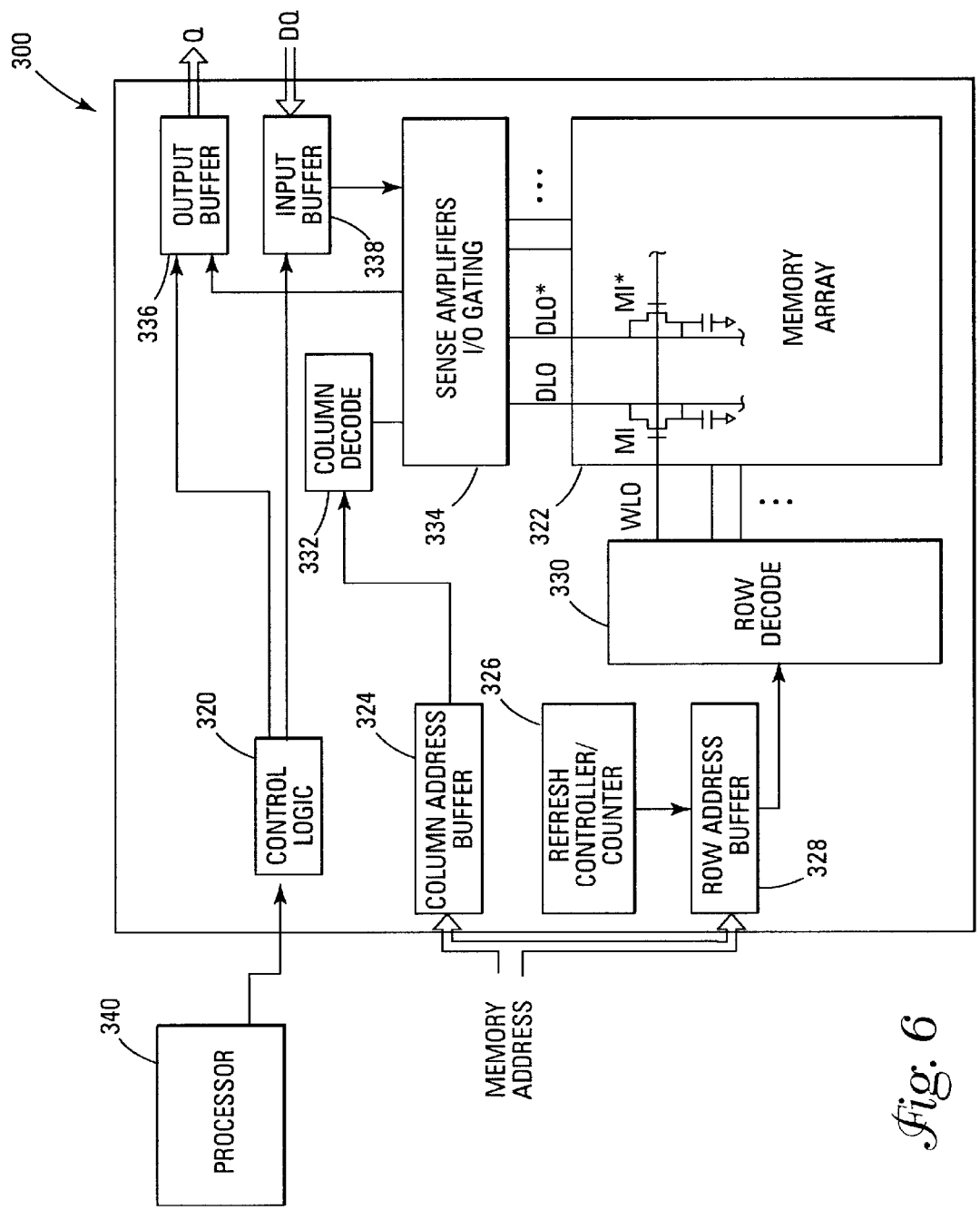
FIG. 6 is block diagram of a memory system of the present invention.

One embodiment of the present invention is illustrated in FIG. 6. FIG. 6 illustrates a simplified block diagram of the relevant parts of a DRAM memory system according to the present invention. A DRAM memory device 300 includes control logic circuit 320 to control read, write, erase and other memory operations. A column address buffer 324 and a row address buffer 328 are adapted to receive memory address requests. A refresh controller/counter 326 is coupled to the row address buffer 328 to control the refresh of the memory array 322. A row decode circuit 330 is coupled between the row address buffer 328 and the memory array 322. A column decode circuit 332 is coupled to the column address buffer 324. Sense amplifiers—I/O gating circuit 334 is coupled between the column decode circuit 332 and the memory array 322. The DRAM memory device 300 is also illustrated as having an output buffer 336 and an input buffer 338. An external processor 340 is coupled to the control logic circuit 320 of the memory device 300 to provide external commands.

Complementary cells M1 and M1* of the memory array 322 are shown in FIG. 6 to illustrate how pairs of associated memory cells are implemented in the present invention. Complementary states or charge are stored in the M1 and M1* that correspond to a data bit. A word line WL0 is coupled to the gates of the M1 and M1*. When the word line WL0 is activated, the charge stored in cell M1 is discharged to digit line DL0 and the charge stored in cell M1* is discharged to digit line DL0*. Digit line DL0 and Digit line DL0* are coupled to a sense amplifier in circuit 334. Although, M1 and M1* are illustrated as being coupled to one word line WL0 in FIG. 6, it will be appreciated by those in the art that a pair of complementary word lines (i.e., WL0 and WL0*) that are fired at the same time could be used, and the present invention is not limited to one word line for each pair of complementary cells.

Figure 7:
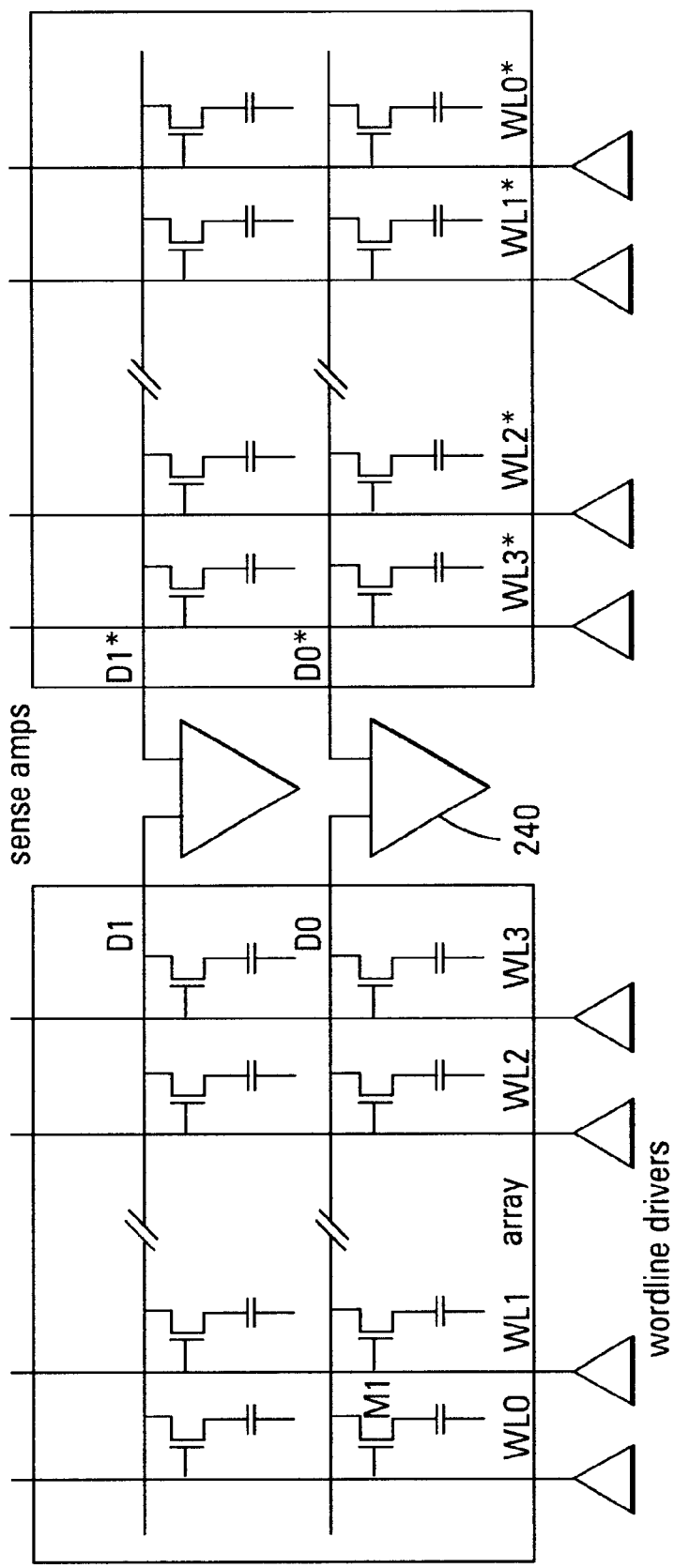
FIG. 7 is a schematic diagram of the physical layout of one embodiment of the present invention wherein the memory cells have an area of $6f^2$ in an open architecture digit line array.

Referring to FIG. 7, one embodiment of the present invention is illustrated. In this embodiment, an open digit line array architecture is used with memory cells having a $6f^2$ area. As stated above, the present invention stores two bits for one data bit wherein the bits are complementary to each other. That is, if one memory cell represents a 1 bit (for example, a charge of +Vcc/2), the complementary memory cell represents a 0 bit (for example, a charge of –Vcc/2). The present invention supplies the 1 bit to one digit line and the 0 bit to a complementary digit line wherein a double differential is supplied to a sense amplifier. For example, referring to FIG. 7, a data bit is stored in cells M1 and M1*. The charge stored in M1 is +Vcc/2 and the charge stored in M1* is –Vcc/2. In one embodiment, a refresh cycle is started by equilibrating digit lines D0 and D0* to Vcc/2. Word lines WL0 and WL0* are then fired simultaneously causing cells M1 and M1* to share their charge (or lack of charge) with their respective digit lines D0 and D0*. Sense amplifier 240 then compares the charge in digit line D0 with the charge in digit line D0* in determining the data bit. The refresh cycle is complete once the sense amplifier 240 causes cells M1 and M1* to be recharged to their respective +Vcc/2 and –Vcc/2 levels.

Figure 8:
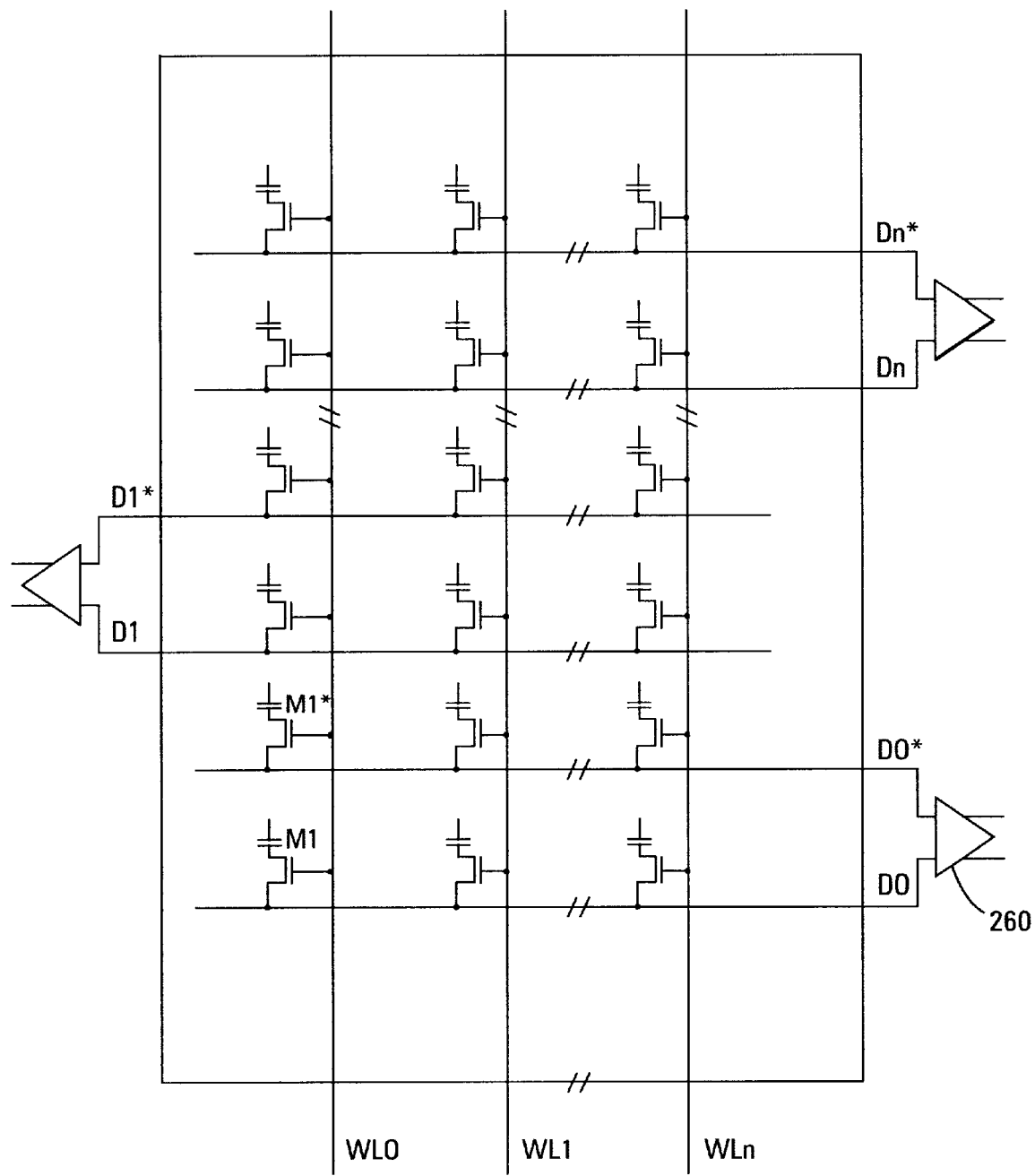
FIG. 8 is a schematic diagram of the physical layout of one embodiment of the present invention wherein the memory cells have an area of $6f^2$ in a folded architecture digit line array.

Referring to FIG. 8, another embodiment of the present invention is illustrated. In this embodiment, a folded digit line array architecture is used with cells having an area of $6f^2$. In this embodiment, a single word line is coupled to the gates of complementary cells. For example, as illustrated in FIG. 8, the single word line WL0 is coupled to the gates of cell M1 and cell M1*. When the word line WL0 is fired, cells M1 and M1* share their charge (or lack of charge) with their respective digit lines D0 and D0*. Sense amplifier 260 the n compares the charge in digit line D0 with the charge in digit line D0* in determining the data bit. This embodiment may be desired because it requires only one word line to be fired in accessing a data bit.

Figure 9:
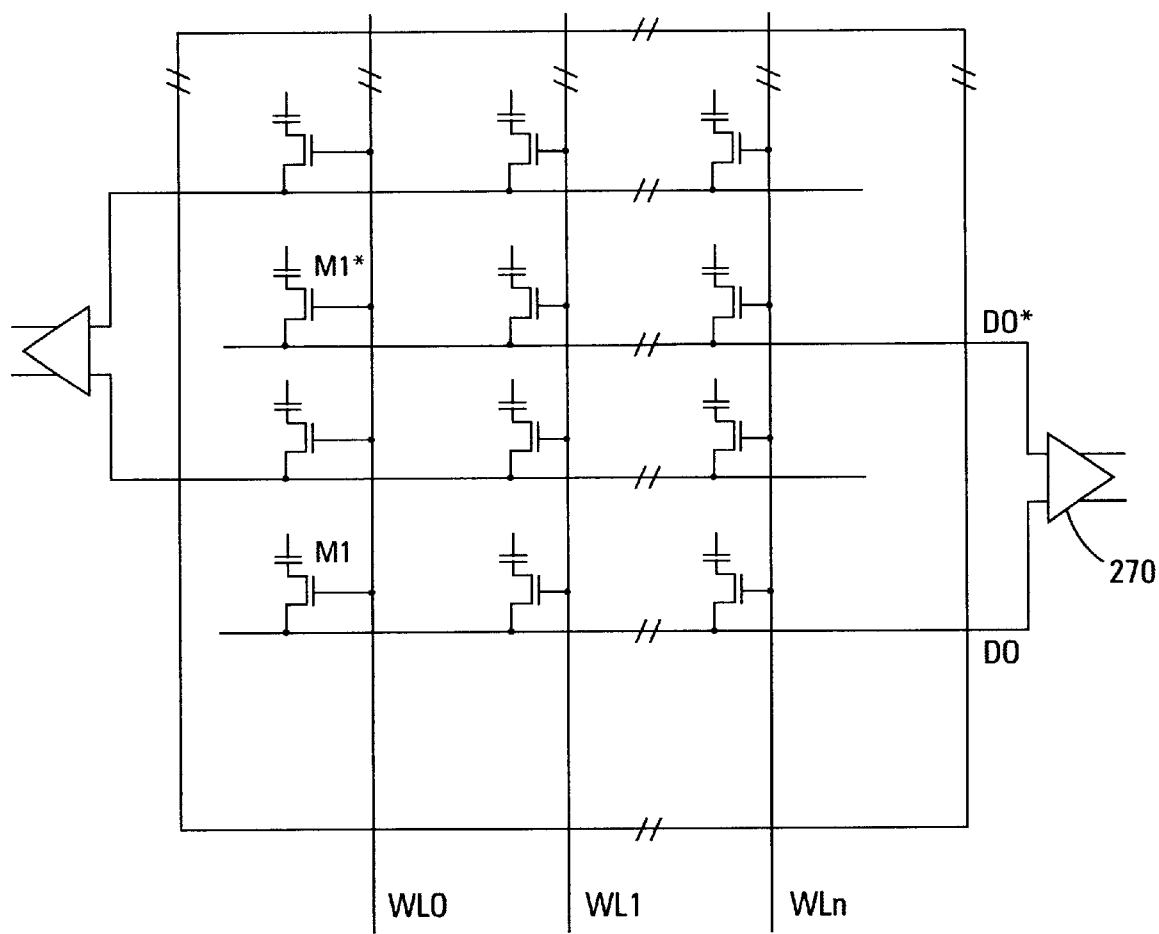
FIG. 9 is a schematic diagram of the physical layout of one embodiment of the present invention wherein the memory cells have an area of $6f^2$ in a folded digit line array, illustrating complementary memory cells not being located adjacent to each other.

FIG. 8 is illustrated having the complementary cells located directly adjacent with each other. In another embodiment having a folded digit line array with cells having an area of $6F^2$, the complementary cells are not positioned directly adjacent with each other. One example of this embodiment is illustrated in FIG. 9. As with the embodiment with the adjacent complementary cells, in this embodiment, the single word line WL0 is coupled to the gates of cell M1 and cell M1*. When the word line WL is fired, cells M1 and M1* share their charge (or lack of charge) with their respective digit lines D0 and D0*. Sense amplifier 270 then compares the charge in digit line D0 with the charge in digit line D0* in determining the data bit.

Figure 10:
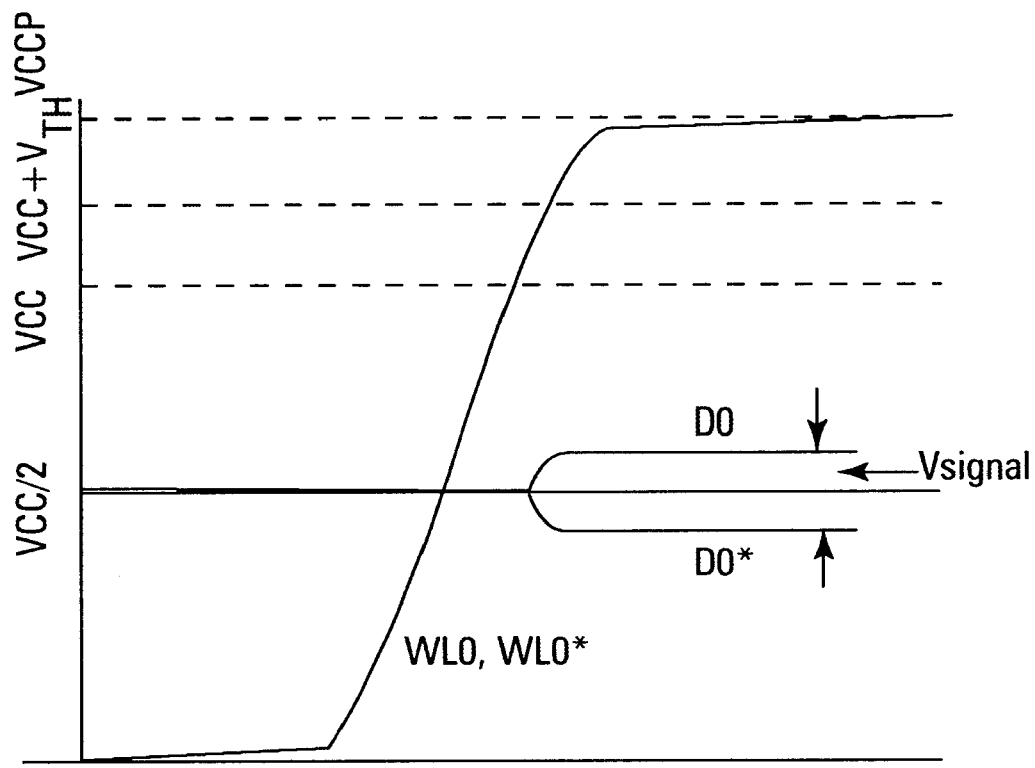
FIG. 10 is a table that illustrates the waveforms during a read or write operation of one embodiment of the present invention.

Referring to FIG. 10, the waveforms during a read or refresh operation of the present invention is illustrated. The magnitude of the voltage difference or signal difference (Vsignal) between digit line D0 and digit line D0* is double the difference as would be found if one of the digit lines were only used as a reference, i.e. Vcc/2, as in the prior art. As previously discussed, the magnitude of Vsignal= (Vcell*Ccell)/(Cdigit+Ccell). As previously shown, a design having Vcell=1.65, Ccell=50 fF, and Cdigit=300 fF yeilds a Vsignal-D0 of 235 mV (for digit line D0 from reference Vcc/2). In the present invention, the magnitude of Vsignal-D0* in which Vcell=−1.65, Ccell=50 fF, and Cdigit=300 fF yields a Vsignal-D0* of −235 mV (for digit line D0* from reference Vcc/2). Therefore, the total magnitude of Vsignal-total will be 470 mV. That is, the total signal difference in D0 and D0*, as sensed by an associated sense amplifier in this example, will be 470 mV.

Although the present invention reduces the overall storage capacity of a DRAM memory array by half, other significant advantages are created. For example, a significant increase in the period required between refreshing cycles of the cells is encountered. A typical refresh rate is around 200 ms in the prior art. Although it would be expected that an increase in the refresh rate would be encountered due to the doubling of the voltages difference supplied to the sense amps, the refresh rate of the present invention is, unexpectedly, approximately a second. Extending the refresh rate out this far allows the memory device to use substantially less power. Moreover, the gains in the refresh rate and less power consumption overcomes the limitations of manufacturing dies having folded digit line architecture arrays with cell areas of $6F^2$. In addition, although the present invention was described as using memory cells with areas of $6F^2$, it will be appreciated in the art that memory cells with areas less than $8F^2$ could be substituted with similar results and the present invention is not limited to memory cells having and area of $6F^2$.

Another benefit of the present invention is that it effectively deals with defective memory cells. By using complementary memory cells, the likelihood of successfully storing the data bit is enhanced because, even if one cell is defective and cannot hold a full charge, the complementary cell will provide enough charge to provide a differential for an associated sense amplifier to detect. Therefore, less redundancy elements are needed in the memory array.

CONCLUSION

An apparatus and method of operating an open digit line and a folded digit line DRAM memory array having a plurality of memory cells wherein, in a plan view, each memory cell, in one embodiment, has an area of $6F^2$, has been described. One method comprises storing a first bit in a first memory cell and storing a second bit that is complementary to the first bit in a second memory cell. The first bit and the second bit form a data bit. The data bit is read by comparing a voltage difference between the first memory cell and the second memory cell.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a folded digit line DRAM memory array having a plurality of memory cells wherein, in a plan view, each memory cell has an area of $6F^2$ comprising:
   storing a first bit in a first memory cell of the folded digit line DRAM memory array; and
   storing a second bit that is complementary to the first bit in a second memory cell of the folded digit line DRAM memory array, wherein the first bit and the second bit form a data bit.

2. The method of claim 1 wherein the data bit is read by sensing a voltage difference between the first memory cell and the second memory cell.

3. The method of claim 2 wherein the sensing of the voltage difference further comprises:
   sharing a charge on a capacitor of the first memory cell with a first digit line;
   sharing a charge on a capacitor of the second memory cell with a second digit line; and
   comparing the voltage difference in the first digit line and the second digit line with a sense amplifier.

4. The method of claim 3 further comprising:
   restoring charge to the capacitor of the first memory cell; and
   restoring charge to the capacitor of the second memory cell.

5. The method of claim 4 wherein the capacitor of the first memory cell is recharged to a predetermined level that represents the first bit.

6. The method of claim 4 wherein the capacitor of the second memory cell is recharged to a predetermined level that represents the second bit.

7. A method of operating an open digit line DRAM memory array having a plurality of memory cells wherein, in a plan view, each memory cell has an area of $6F^2$ comprising:
   storing a first bit in a first memory cell of the open digit line DRAM memory array; and
   storing a second bit that is complementary to the first bit in a second memory cell of the open digit line DRAM memory array, wherein the first bit and the second bit form a data bit.

8. The method of claim 7 wherein the data bit is read by sensing a voltage difference between the first memory cell and the second memory cell.

9. The method of claim 8 wherein the sensing of the voltage difference further comprises:
   sharing a charge on a capacitor of the first memory cell with a first digit line;
   sharing a charge on a capacitor of the second memory cell with a second digit line; and
   comparing the voltage difference in the first digit line and the second digit line with a sense amplifier.

10. The method of claim 9 further comprising:
restoring charge to the capacitor of the first memory cell; and
restoring charge to the capacitor of the second memory cell.

11. The method of claim 10 wherein the capacitor of the first memory cell is recharged to a predetermined level that represents the first bit.

12. The method of claim 10 wherein the capacitor of the second memory cell is recharged to a predetermined level that represents the second bit.

13. A method of operating a DRAM memory device having a memory array with multiple memory cells arranged in a folded digit line architecture wherein each memory cell has an area of $6F^2$ comprising:
storing a charge in a first memory cell of the memory array with multiple memory cells arranged in a folded digit line architecture; and
storing a complementary charge on an associated second memory cell of the memory array with multiple memory cells arranged in a folded digit line architecture, wherein the charge in the first memory cell and the complementary charge in the associated second memory cell together form a single data bit.

14. The method of claim 13 wherein the charge stored in the first memory cell represents a logic 1 state and the complementary charge stored in the second memory cell represents a logic 0 state.

15. The method of claim 13 wherein the charge stored in the first memory cell represents a logic 0 state and the complementary charge stored in the second memory cell represents a logic 1 state.

16. The method of claim 13 further comprising:
reading the data bit stored in the first and second memory cells.

17. The method of claim 16 wherein reading the data bit further comprises:
precharging a first digit line to a predetermined level;
precharging a second digit line to the same predetermined level as the first digit line;
sharing the charge stored in a capacitor of the first memory cell with the first digit line;
sharing the charge stored in a capacitor of the second memory cell with the second digit line; and
comparing the voltage in the first digit line with he voltage in the second digit line to determine the value of the data bit.

18. The method of claim 17 further comprising;
restoring the charge in the first memory cell; and
restoring the charge in the second memory cell.

19. A method of operating a DRAM memory device having a memory array with multiple memory cells arranged in an open digit line architecture wherein each memory cell has an area of $6F^2$ comprising:
storing a charge in a first memory cell of the memory array with multiple memory cells arranged in a open digit line architecture; and
storing a complementary charge on an associated second memory cell of the memory array with multiple memory cells arranged in a open digit line architecture, wherein the charge in the first memory cell and the complementary charge in the associated second memory cell together form a single data bit.

20. The method of claim 19 wherein the charge stored in the first memory cell represents a logic 1 state and the complementary charge stored in the second memory cell represents a logic 0 state.

21. The method of claim 19 wherein the charge stored in the first memory cell represents a logic 0 state and the complementary charge stored in the second memory cell represents a logic 1 state.

22. The method of claim 19 further comprising:
reading the data bit stored in the first and second memory cells.

23. The method of claim 22 wherein reading the data bit further comprises:
precharging a first digit line to a predetermined level;
precharging a second digit line to the same predetermined level as the first digit line;
sharing the charge stored in a capacitor of the first memory cell with the first digit line;
sharing the charge stored in a capacitor of the second memory cell with the second digit line; and
comparing the voltage in the first digit line with he voltage in the second digit line to determine the value of the data bit.

24. The method of claim 23 further comprising;
restoring the charge in the first memory cell; and
restoring the charge in the second memory cell.

25. A method of refreshing memory cells in a DRAM memory having a memory array of memory cells arranged in an folded digit line architecture wherein, in a plan view, each memory cell has an area of $6F^2$ comprising:
storing a first bit in a first memory cell of the memory array of memory cells arranged in the folded digit line architecture;
storing a complementary second bit in an associated second memory cell of the memory array of memory cells arranged in the folded digit line architecture, wherein the first bit and the complementary second bit form a data bit;
comparing a voltage difference between the first bit in the first memory cell and the second bit in the second memory cell with a sense amplifier to read the data bit;
restoring the first bit in the first memory cell to a predetermined voltage level; and
restoring the second bit in the second memory cell to a predetermined voltage level.

26. The method of claim 25 wherein comparing the voltage difference further comprises:
precharging a first and second digit line to a predetermined voltage;
sharing a charge of the first bit of the first memory cell with the first digit line;
sharing a charge of the second bit of the second memory cell with the second digit line; and
comparing the voltage difference between the first digit line and the second digit line.

27. The method of claim 25 wherein the first data bit is a charge representing a logic 1 state and the second data bit is a charge representing a logic 0 state.

28. The method of claim 25 wherein the first data bit is a charge that represents a logic 0 state and the second data bit is a charge that represents a logic 1 state.

29. A method of refreshing memory cells in a DRAM memory having a memory array of memory cells arranged in an open digit line architecture wherein, in a plan view, each memory cell has an area of $6F^2$ comprising:
storing a first bit in a first memory cell of the memory array of memory cells arranged in the open digit line architecture;

storing a complementary second bit in an associated second memory cell of the memory array of memory cells arranged in the open digit line architecture, wherein the first bit and the complementary second bit form a data bit;

comparing a voltage difference between the first bit in the first memory cell and the second bit in the second memory cell with a sense amplifier to read the data bit;

restoring the first bit in the first memory cell to a predetermined voltage level; and restoring the second bit in the second memory cell to a predetermined voltage level.

30. The method of claim 29 wherein comparing the voltage difference further comprises:

precharging a first and second digit line to a predetermined voltage;

sharing a charge of the first bit of the first memory cell with the first digit line;

sharing a charge of the second bit of the second memory cell with the second digit line; and comparing the voltage difference between the first digit line and the second digit line.

31. The method of claim 29 wherein the first data bit is a charge representing a logic 1 state and the second data bit is a charge representing a logic 0 state.

32. The method of claim 29 wherein the first data bit is a charge that represents a logic 0 state and the second data bit is a charge that represents a logic 1 state.

33. A DRAM memory device having a folded architecture memory array of memory cells wherein, in a plan view, each memory cell has an area of $6F^2$, the DRAM memory device comprising:

a plurality of pairs of associated memory cells to store data bits of the folded architecture memory array, wherein each pair of associated memory cells includes,
a first memory cell to store a first bit, and
a second memory cell to store a second bit that is a complement of the first bit, wherein the first bit and the second bit form a data bit; and a plurality of sense amplifiers to read the memory cells, each sense amplifier is coupled to an associated pair of memory cells, wherein each sense amplifier compares a voltage between the first bit of the first memory cell and the second bit of the second memory cell to read the data bit.

34. The DRAM memory device of claim 33 wherein each sense amplifier restores the first bit and second bit to predetermined voltage levels based on the data bit read.

35. The DRAM memory device of claim 33 further comprises a control logic circuit to control memory operations, wherein the control logic circuit fires a word line coupled to the first and second memory cells of an associated pair of memory cells to read a data bit.

36. The DRAM memory device of claim 35 further comprising:

a plurality of digit lines to coupled the memory cells to the sense amplifiers.

37. The DRAM memory device of claim 36 wherein the control logic circuit equilibrates the digit lines coupled between the first memory cell and the second memory cell to a predetermined voltage level before the data bit stored in the first and second memory cells is read.

38. A DRAM memory device having an open architecture memory array of memory cells wherein, in a plan view, each memory cell has an area of $6F^2$, the DRAM memory device comprising:

a plurality of pairs of associated memory cells to store data bits of the open architecture memory array, wherein each pair of associated memory cells includes,
a first memory cell to store a first bit, and
a second memory cell to store a second bit that is a complement of the first bit, wherein the first bit and the second bit form a data bit; and a plurality of sense amplifiers to read the memory cells, each sense amplifier is coupled to an associated pair of memory cells, wherein each sense amplifier compares a voltage between the first bit of the first memory cell and the second bit of the second memory cell to read the data bit.

39. The DRAM memory device of claim 38 wherein each sense amplifier restores the first bit and second bit to predetermined voltage levels based on the data bit read.

40. The DRAM memory device of claim 38 further comprises a control logic circuit to control memory operations, wherein the control logic circuit simultaneously fires word lines coupled to the first and second memory cells of an associated pair of memory cells to read a data bit.

41. The DRAM memory device of claim 40 further comprising:

a plurality of digit lines to coupled the memory cells to the sense amplifiers.

42. The DRAM memory device of claim 41 wherein the control logic circuit equilibrates the digit lines coupled between the first memory cell and the second memory cell to a predetermined voltage level before the data bit stored in the first and second memory cells is read.

43. A DRAM memory device comprising:

a memory array having a plurality of memory cells arranged in a folded digit line architecture wherein each memory cell has an area of $6F^2$;

each memory cell is associated with another memory cell, wherein each pair of associated memory cells store complementary bits that make up a data bit;

a plurality of sense amplifiers to read and refresh memory cells, each sense amplifier is coupled to a pair of associated memory cells; and a control logic circuit to control memory operations, wherein the control circuit selectively fires a word line coupled to the associated memory cells so a sense amplifier coupled to the associated pair of memory cells can read and refresh the data bit stored in the pair of associated memory cells.

44. The DRAM memory device of claim 43 wherein the memory cells of the associated pair of memory cells are located adjacent to each other.

45. The DRAM memory device of claim 43 wherein the memory cells of the associated pair of memory cells are not located adjacent to each other.

46. The DRAM memory device of claim 43 wherein each associated pair of memory cells is coupled to an associated sense amplifier by a pair of digit lines.

47. The DRAM memory device of claim 46 wherein the control logic circuit equilibrates each pair of digit lines before a read or refresh operation is performed on the memory cells coupled to the digit lines.

48. A DRAM memory device comprising:

a memory array having a plurality of memory cells arranged in an open digit line architecture wherein each memory cell has an area of $6F^2$;

each memory cell is associated with another memory cell, wherein each pair of associated memory cells store complementary bits that make up a data bit;

a plurality of sense amplifiers to read and refresh memory cells, each sense amplifier is coupled to a pair of associated memory cells; and a control logic circuit to control memory operations, wherein the control circuit selectively fires word lines coupled to associated memory cells simultaneously so a sense amplifier coupled to the associated pair of memory cells can read and refresh the data bit stored in the pair of associated memory cells.

49. The DRAM memory device of claim 48 wherein each associated pair of memory cells is coupled to an associated sense amplifier by a pair of digit lines.

50. The DRAM memory device of claim 49 wherein the control logic circuit equilibrates each pair of digit lines before a read or refresh operation is performed on the memory cells coupled to the digit lines.

51. A memory system comprising:

a processor to provide external commands; and a DRAM memory device comprising,
- a memory array having memory cells arranged in a folded digit line architecture, wherein each of the memory cells has an area of $6F^2$ in a plan view,
- each memory cell is associated with another memory cell, wherein each pair of associated memory cells store complementary bits to form a data bit,
- a sense amplifier for each pair of associated memory cells to read data bits, wherein each sense amplifier is coupled to compare voltages of the bits in associated pairs of memory cells, and
- a control logic circuit to receive external commands from the processor and to control memory operation, wherein the control circuit selectively fires a word line coupled to each associated memory cell to read a data bit.

52. The memory system of claim 51 further comprising:

a pair of digit lines for each pair of associated memory cells, wherein one of the digit lines is coupled between one of the associated memory cells and an associated sense amplifier and the other digit line is coupled between the other one of the associated memory cells and the associated sense amplifier.

53. The memory system of claim 52 wherein the control logic circuit equilibrates each pair of digit lines prior to a read operation.

54. The memory system of claim 51 wherein one of the memory cells of a pair of associated memory cells stores a 1 bit and the other memory cell of the pair of associated memory cells stores a 0.

55. The memory system of claim of 51 wherein the sense amplifiers restore each associated memory cell bit to a predefined voltage level following a read operation.

56. The memory system of claim 55 wherein the control logic circuit keeps the respective word lines on until each cell is restored to its predefined voltage level.

57. A memory system comprising:

a processor to provide external commands; and a DRAM memory device comprising,
- a memory array having memory cells arranged in an open digit line architecture, wherein each of the memory cells has an area of $6F^2$ in a plane view,
- each memory cell is associated with another memory cell, wherein each pair of associated memory cells store complementary bits to form a data bit,
- a sense amplifier for each pair of associated memory cells to read data bits, wherein each sense amplifier is coupled to compare voltages of the bits in associated pairs of memory cells, and
- a control logic circuit to receive external commands from the processor and to control memory operation, wherein the control circuit selectively fires word lines coupled to associated memory cells simultaneously to read a data bit.

58. The memory system of claim 57 further comprising:

a pair of digit lines for each pair of associated memory cells, wherein one of the digit lines is coupled between one of the associated memory cells and an associated sense amplifier and the other digit line is coupled between the other one of the associated memory cells and the associated sense amplifier.

59. The memory system of claim 58 wherein the control logic circuit equilibrates each pair of digit lines prior to a read operation.

60. The memory system of claim 57 wherein one of the memory cells of a pair of associated memory cells stores a 1 bit and the other memory cell of the pair of associated memory cells stores a 0.

61. The memory system of claim of 57 wherein the sense amplifiers restore each associated memory cell bit to a predefined voltage level following a read operation.

62. The memory system of claim 61 wherein the control logic circuit keeps the respective word lines on until each cell is restored to its predefined voltage level.

63. A method of operating a folded digit line DRAM memory array having a plurality of memory cells wherein, in a plan view, each memory cell having an area less than $8F^2$ comprising:

storing a first bit in a first memory cell of the folded digit line DRAM memory array; and storing a second bit that is complementary to the first bit in a second memory cell of the folded digit line DRAM memory array, wherein the first bit and the second bit form a data bit.

64. The method of claim 63 wherein the data bit is read by sensing a voltage difference between the first memory cell and the second memory cell.

65. The method of claim 64 wherein the sensing of the voltage difference further comprises:

sharing a charge on a capacitor of the first memory cell with a first digit line;

sharing a charge on a capacitor of the second memory cell with a second digit line; and comparing the voltage difference in the first digit line and the second digit line with a sense amplifier.

66. The method of claim 65 further comprising:

restoring charge to the capacitor of the first memory cell; and restoring charge to the capacitor of the second memory cell.

67. The method of claim 66 wherein the capacitor of the first memory cell is recharged to a predetermined level that represents the first bit.

68. The method of claim 66 wherein the capacitor of the second memory cell is recharged to a predetermined level that represents the second bit.

69. A method of operating an open digit line DRAM memory array having a plurality of memory cells wherein, in a plan view, each memory cell having an area of less than $8F^2$ comprising:

storing a first bit in a first memory cell of the open digit line DRAM memory array; and storing a second bit that is complementary to the first bit in a second memory cell of the open digit line DRAM memory array, wherein the first bit and the second bit form a data bit.

70. The method of claim 69 wherein the data bit is read by sensing a voltage difference between the first memory cell and the second memory cell.

71. The method of claim 70 wherein the sensing of the voltage difference further comprises:
   sharing a charge on a capacitor of the first memory cell with a first digit line;
   sharing a charge on a capacitor of the second memory cell with a second digit line; and
   comparing the voltage difference in the first digit line and the second digit line with a sense amplifier.

72. The method of claim 71 further comprising:
   restoring charge to the capacitor of the first memory cell; and
   restoring charge to the capacitor of the second memory cell.

73. The method of claim 72 wherein the capacitor of the first memory cell is recharged to a predetermined level that represents the first bit.

74. The method of claim 72 wherein the capacitor of the second memory cell is recharged to a predetermined level that represents the second bit.

75. A DRAM memory device having a folded architecture memory array of memory cells wherein, in a plan view, each memory cell has an area of less than $8F^2$, the DRAM memory device comprising:
   a plurality of pairs of associated memory cells to store data bits of the folded architecture memory array, wherein each pair of associated memory cells includes,
      a first memory cell to store a first bit, and
      a second memory cell to store a second bit that is a complement of the first bit, wherein the first bit and the second bit form a data bit; and
   a plurality of sense amplifiers to read the memory cells, each sense amplifier is coupled to an associated pair of memory cells, wherein each sense amplifier compares a voltage between the first bit of the first memory cell and the second bit of the second memory cell to read the data bit.

76. The DRAM memory device of claim 75 wherein each sense amplifier restores the first bit and second bit to predetermined voltage levels based on the data bit read.

77. The DRAM memory device of claim 75 further comprises
   a control logic circuit to control memory operations, wherein the control logic circuit fires a word line coupled to the first and second memory cells of an associated pair of memory cells to read a data bit.

78. The DRAM memory device of claim 77 further comprising:
   a plurality of digit lines to coupled the memory cells to the sense amplifiers.

79. The DRAM memory device of claim 78 wherein the control logic circuit equilibrates the digit lines coupled between the first memory cell and the second memory cell to a predetermined voltage level before the data bit stored in the first and second memory cells is read.

80. A DRAM memory device having an open architecture memory array of memory cells wherein, in a plan view, each memory cell has an area of less than $8F^2$, the DRAM memory device comprising:
   a plurality of pairs of associated memory cells to store data bits of the open architecture memory array, wherein each pair of associated memory cells includes,
      a first memory cell to store a first bit, and
      a second memory cell to store a second bit that is a complement of the first bit, wherein the first bit and the second bit form a data bit; and
   a plurality of sense amplifiers to read the memory cells, each sense amplifier is coupled to an associated pair of memory cells, wherein each sense amplifier compares a voltage between the first bit of the first memory cell and the second bit of the second memory cell to read the data bit.

81. The DRAM memory device of claim 80 wherein each sense amplifier restores the first bit and second bit to predetermined voltage levels based on the data bit read.

82. The DRAM memory device of claim 80 further comprises
   a control logic circuit to control memory operations, wherein the control logic circuit simultaneously fires word lines coupled to the first and second memory cells of an associated pair of memory cells to read a data bit.

83. The DRAM memory device of claim 82 further comprising:
   a plurality of digit lines to coupled the memory cells to the sense amplifiers.

84. The DRAM memory device of claim 83 wherein the control logic circuit equilibrates the digit lines coupled between the first memory cell and the second memory cell to a predetermined voltage level before the data bit stored in the first and second memory cells is read.

* * * * *